US 6,617,216 B1

(12) United States Patent
Hu

(10) Patent No.: US 6,617,216 B1
(45) Date of Patent: Sep. 9, 2003

(54) QUASI-DAMASCENE GATE, SELF-ALIGNED SOURCE/DRAIN METHODS FOR FABRICATING DEVICES

(75) Inventor: Hung-Kwei Hu, Saratoga, CA (US)

(73) Assignee: Applied Materials, Inc, Santa Clara, CA (US)

(*) Notice: Subject to any disclaimer, the term of this patent is extended or adjusted under 35 U.S.C. 154(b) by 0 days.

(21) Appl. No.: 10/117,575

(22) Filed: Apr. 4, 2002

(51) Int. Cl.[7] ............................................. H01L 21/336
(52) U.S. Cl. ........................ 438/296; 438/303; 438/595
(58) Field of Search ........................... 257/192; 438/159, 438/163, 174, 179, 180, 182, 184, 194–196, 201, 202, 207, 217, 221, 229–232, 294, 296, 301, 303, 385, 595, 574

(56) References Cited

U.S. PATENT DOCUMENTS

| | | | |
|---|---|---|---|
| 5,597,752 A | 1/1997 | Niwa | 438/291 |
| 5,998,290 A * | 12/1999 | Wu et al. | 438/595 |
| 6,013,570 A | 1/2000 | Yu et al. | 438/595 |
| 6,075,274 A * | 6/2000 | Wu et al. | 257/413 |
| 6,514,842 B1 * | 2/2003 | Prall et al. | 438/593 |
| 2003/0054623 A1 * | 3/2003 | Weimer et al. | 438/587 |

* cited by examiner

Primary Examiner—Kamand Cuneo
Assistant Examiner—Asok Kumar Sarkar
(74) Attorney, Agent, or Firm—Michael B. Einschlag; Joseph Bach

(57) ABSTRACT

Methods for use in fabricating integrated circuit structures. One embodiment of the present invention is a quasi-damascene gate, self-aligned source/drain method for forming a device on a substrate that includes steps of: (a) forming a gate dielectric layer over the substrate; (b) forming a first gate electrode layer over the gate dielectric layer; (c) forming a contact etch stop layer over the first gate electrode layer; (d) forming a self-aligning layer over the contact etch stop layer; and (e) forming and patterning a mask over the self-aligning layer.

54 Claims, 18 Drawing Sheets

QUASI-DAMASCENE GATE, SELF-ALIGNED SOURCE/DRAIN METHODS FOR FABRICATING DEVICES

TECHNICAL FIELD OF THE INVENTION

One or more embodiments of the present invention pertain to methods for use in fabricating integrated circuit device structures.

BACKGROUND OF THE INVENTION

Integrated circuits or devices ("ICs") contain an ever increasing number of devices that operate at ever increasing speeds to provide an ever increasing amount of functionality. One consequence is that transistor devices (and other structures) that form building blocks of ICs are being made smaller and smaller. In addition, in order to keep up with decreasing costs of ICs, IC manufacturers require yields to improve, even as the size of transistor devices (and other structures) goes down.

In forming transistor devices on a wafer or substrate in accordance with typical prior art IC manufacturing techniques, a sacrificial oxide layer and a nitride layer are deposited on the substrate to enable fabrication of shallow trench isolation ("STI") structures (as is well known, the sacrificial oxide layer is formed because a nitride layer does not adhere directly to the silicon substrate). Next, the STIs are formed, and the nitride layer and the sacrificial oxide layer are removed. Next, a gate oxide layer is formed on the substrate, and a polysilicon layer is formed thereon. Next, the polysilicon layer is plasma etched to define the gate (sometimes after n-doping some devices on the wafer, and p-doping other devices on the wafer) using, for example, a low selectivity-to-oxide "main" etch for a majority of the thickness of the polysilicon layer (the gate oxide acts as an etch stop), and then a high selectivity-to-oxide etch for the remainder of the polysilicon layer. Next, a silicide layer (for example, a $TiSi_x$ layer) that forms a portion of the source/drain is created. Next, a dielectric layer, for example, an oxide layer, is deposited on the wafer (for example, over the silicide layer). Next, source/drain contact holes are defined by a photoresist ("PR") patterning process. Next, a plasma "contact" etch process etches the oxide layer to form or open the contact holes.

In forming transistor devices according to the above-described prior art IC manufacturing techniques, several problems occur. A first problem in using the above-described prior art IC manufacturing techniques occurs because source/drain contacts of the transistor device are formed using a PR patterning process. Because such a PR patterning process suffers from alignment errors, the source/drain contacts may be asymmetrically located with respect to the gate electrode of the transistor device, and/or the source/drain contacts may touch the edge of the device (this may cause problems such as device leakage). To mitigate the effect of such alignment errors, design allowances must be made. Typical design allowances limit the size of the contacts, as well as distances between the source/drain contacts and the gate electrode. Hence, it is difficult to shrink the size of the transistor device.

A second problem in using the above-described prior art IC manufacturing techniques occurs because etching the dielectric layer (for example, using a plasma "contact" etch process) to form a contact hole is a difficult process to control, and to control accurately.

A third problem in using the above-described prior art IC manufacturing techniques occurs because of the manner in which the source/drain are formed. As described above, a plasma "contact" etch process opens source/drain contact holes, and as a result, a silicide layer is exposed to the plasma contact etch, and may be damaged. Such damage may increase contact resistance, and, together with design restrictions on the size of the contact, makes it more difficult to design low resistance contacts.

A fourth problem in using the above-described prior art IC manufacturing techniques occurs because of the need to fabricate faster and smaller devices. To do this, one might use materials other than polycrystalline silicon ("polysilicon") to fabricate the gate electrode. In particular, one might use materials such as, for example, tungsten ("W"), silicon-germanium ("SiGe"), and so forth. One problem with using such materials to fabricate the gate electrode in accordance with a typical prior art fabrication process is a need to develop methods to etch them.

A fifth problem in using the above-described prior art IC manufacturing techniques occurs because of limitations in current photolithography in defining dimensions less than 0.13 $\mu$m. Because of these limitations, there is a need to develop structures that are used to define the width of a gate electrode. In accordance with prior art IC manufacturing techniques, structures used to define the width of the gate electrode are formed by etching PR layers laterally. This is a problem because (when such etching processes are used) the thickness of the PR layer decreases at the same time that it is trimmed laterally. As a result, the PR layer may become too thin to act reliably as a mask for etching the gate electrode.

A sixth problem in using the above-described prior art IC manufacturing techniques occurs when the gate electrode comprises a metal/polysilicon gate structure. In accordance with prior art techniques, a thickness of the polysilicon layer must be large enough to enable the polysilicon layer to provide an etch stop for an etch process that defines the metal gate. This causes a problem because it is desirable for the polysilicon layer to be thin (the thinner the better) to form a fast device. The need for the polysilicon layer to act as an etch stop inhibits a designer's ability to make the polysilicon layer as thin as possible, and hence, impacts device speed.

A seventh problem in using the above-described prior art IC manufacturing techniques occurs when a polysilicon layer is plasma etched to define the gate. For example, when a majority of the thickness of the polysilicon layer is etched using a low selectivity-to-oxide main etch, the gate oxide may be exposed to the plasma and, thereby, suffer some damage. Further, the plasma etch process may punch through the gate oxide to fatally damage the device.

An eighth problem in using the above-described prior art IC manufacturing techniques occurs because of the manner in which the gate is formed. As was described above, a sacrificial oxide layer and a nitride layer are deposited on the substrate to enable fabrication of STI structures. Next, after the STI structures are formed, the nitride layer and the sacrificial oxide layer are removed (thereby processing the silicon substrate surface). Next, a gate oxide layer is formed. Because of this, the gate oxide layer in the device has been formed on a processed silicon surface. Such processing of the substrate may reduce the yield of the devices since the gate oxide is perhaps the most fragile component of the device.

A ninth problem in using the above-described prior art IC manufacturing techniques occurs because fabrication of p-channel CMOS devices requires etching p-doped gate electrodes, and fabrication of n-channel CMOS devices requires etching n-doped gate electrodes. However, n-doped gate electrodes etch faster than p-doped gate electrodes. This causes a problem in etching when ICs having both types of devices (known as dual gate) are fabricated on the same substrate.

A tenth problem in using the above-described prior art IC manufacturing techniques occurs because differences in sidewall profile slope result in areas of a substrate (used to fabricate the ICs) that have densely spaced devices, and areas of the substrate that have substantially less densely spaced devices. As is well known, such differences in sidewall profile slope occur because of backsputter due to etching areas surrounding the devices. For example, for sparsely spaced devices, there is more backsputter than for densely spaced devices.

In light of the above, there is a need in the art for methods that solve one or more of the above-described problems.

SUMMARY OF THE INVENTION

One or more embodiments of the present invention advantageously satisfy the above-identified need in the art, and provide one or more methods for use in fabricating integrated circuit device structures. Specifically, one embodiment of the present invention is a quasi-damascene gate, self-aligned source/drain method for forming a device on a substrate that comprises steps of: (a) forming a gate dielectric layer over the substrate; (b) forming a first gate electrode layer over the gate dielectric layer; (c) forming a contact etch stop layer over the first gate electrode layer; (d) forming a self-aligning layer over the contact etch stop layer; and (e) forming and patterning a mask over the self-aligning layer.

DETAILED DESCRIPTION

Figure 1:
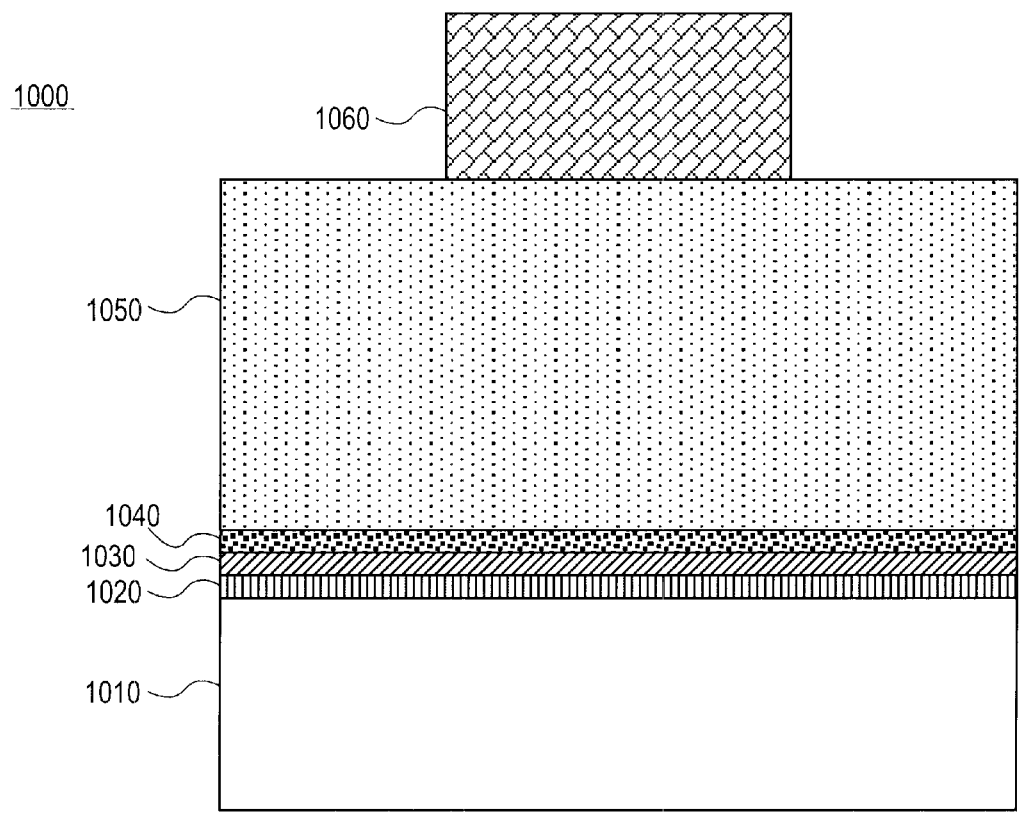
FIG. 1 shows a block diagram of a cross section of a structure that is fabricated in accordance with one or more embodiments of the present invention to provide a structure that is ready for formation of isolation structures.

The following describes embodiments of the present invention that are used to fabricate devices (for example, transistor devices having a gate, a source and a drain) on a substrate in accordance with inventive quasi-damascene gate, self-aligned source/drain processes.

In accordance with one or more embodiments of the quasi-damascene gate, self-aligned source/drain processes of the present invention (and as will described in detail below), a gate dielectric (for example, a gate oxide) is formed on a substrate surface prior to the formation of isolation structures. As was pointed out in the Background of the Invention, a typical prior art fabrication process utilizes a sacrificial oxide to enable fabrication of shallow trench isolation ("STI") structures. As such, this typical prior art fabrication process is disadvantageous since it causes the substrate to be processed, and thereby may adversely impact device yield.

In accordance with one or more embodiments of the quasi-damascene gate, self-aligned source/drain processes of the present invention (and as will described in detail below), an inventive hardmask structure is utilized to define a gate electrode having dimensions less than 0.13 µm. As was pointed out in the Background of the Invention, a typical prior art fabrication process utilizes a photoresist ("PR") mask to define the gate electrode, and may result in unreliable fabrication processes.

In accordance with one or more embodiments of the quasi-damascene gate, self-aligned source/drain processes of the present invention (and as will described in detail below), a gate electrode can be fabricated using materials such as, for example, tungsten ("W"), silicon-germanium ("SiGe"), and so forth, without having to develop methods to etch them to define the width of the gate electrode as would be the case for a typical prior art fabrication process.

In accordance with one or more embodiments of the quasi-damascene gate, self-aligned source/drain processes of the present invention (and as will described in detail below), a major portion of source/drain contact holes are defined by wet etching a self-aligning layer, and stopping on a contact etch stop layer. As was pointed out in the Background of the Invention, a typical prior art fabrication process utilizes a plasma "contact" etch process to form contact holes. This typical prior art fabrication process is disadvantageous because plasma "contact" etch processes are difficult to control, and to control accurately. As a result, device yield is impacted adversely.

In accordance with one or more embodiments of the damascene gate processes of the present invention (and as will described in detail below), a "self-aligning" layer is used to define contact holes, i.e., the source and drain contacts are formed without having to perform PR patterning processes. Because the self-aligning layer is used to define the contact holes, the source/drain contacts are self-aligned to the source and drain, and the contacts are self-aligned to the gate electrode. As was pointed out in the Background of the Invention, a typical prior art fabrication process utilizes a PR patterning process to define contact holes. As a result, because prior art PR patterning processes suffer from alignment errors, source/drain contacts may be asymmetrically located with respect to the gate electrode of a transistor device. This typical prior art fabrication process is disadvantageous because it requires making design allowances that: (a) limit the size of the contacts, and (b) limit distances between the source/drain contacts and the gate electrode.

In accordance with one or more embodiments of the quasi-damascene gate processes of the present invention (and as will described in detail below), a thin gate electrode is formed as a first gate electrode layer and a second gate electrode layer. Further, the second gate electrode layer is not formed over an area where the source and drains will be formed. As result, when etching the first gate electrode layer (for example, polysilicon) to form the source and drain, although the gate dielectric (for example, gate oxide) acts as an etch stop, an exposure time of the gate oxide to a plasma environment is reduced, and a high-selectivity-to-oxide etch is used.

FIG. 1 shows a block diagram of a cross section of structure 1000 that is fabricated in accordance with one or more embodiments of the quasi-damascene gate processes of the present invention to provide a structure that is ready for formation of isolation structures. As shown in FIG. 1, structure 1000 comprises silicon substrate 1010 that is formed in accordance with any one of a number of methods that are well known to those of ordinary skill in the art. As further shown in FIG. 1, gate dielectric layer 1020, for example, and without limitation, gate oxide, is formed over silicon substrate 1010 in accordance with any one of a number of methods that are well known to those of ordinary skill in the art. For example, one can form gate dielectric layer 1020 as a gate oxide by use of a well known thermal oxide process to provide silicon oxide. Gate dielectric layer 1020 may be as thick or as thin as is necessary to fabricate a particular device. For example, in accordance with some embodiments, gate dielectric layer 1020 may be as thin as 20 angstroms (20 Å) or less. As still further shown in FIG. 1, layer 1030 is formed over gate dielectric layer 1020. As will be understood in conjunction with the description set forth below, layer 1030 is a first gate electrode layer. In accordance with some embodiments of the present invention, one can deposit layer 1030 as a layer of polycrystalline silicon ("polysilicon") in accordance with any one of a number of methods that are well known to those of ordinary skill in the art (for example, by use of a well known low pressure chemical vapor deposition ("LPCVD") process). When formed as a polysilicon layer, in accordance with some embodiments, layer 1030 can be about 300 Å thick, or it may be any other thickness that is suitable for, and compatible with, subsequent processing as described below (which other thicknesses may be determined readily by one of ordinary skill in the art without undue experimentation). Note that layer 1030 may be fabricated from materials other than polysilicon that are useful in forming devices enabled by one or more embodiments of the present invention. As such, further embodiments of the present invention exist where layer 1030 comprises silicon-germanium ("SiGe"), or other material or materials used to fabricate a gate electrode.

As yet still further shown in FIG. 1, layer 1040 is formed over layer 1030. As will be understood in conjunction with the description set forth below, layer 1040 acts (in one aspect) as a contact etch stop layer. In accordance with some embodiments of the present invention, one can deposit layer 1040 as an oxide layer in accordance with any one of a number of methods that are well known to those of ordinary skill in the art. For example, one can deposit layer 1040 as a relatively thin oxide by use of well known plasma chemical vapor deposition ("PCVD") oxide processes to provide silicon oxide, or an equivalent process. Oxide layer 1040 can be about 300 Å thick, or it may be any other thickness that is suitable for, and compatible with, subsequent processing as described below (which other thicknesses may be determined readily by one of ordinary skill in the art without undue experimentation).

As yet again still further shown in FIG. 1, layer 1050 is formed over layer 1040. As will be understood in conjunction with the description set forth below, layer 1050 is a "self-aligning" layer that, among other things, helps define contacts as a result of subsequent processing. In accordance with some embodiments of the present invention, one can deposit layer 1050 as a nitride layer in accordance with any one of a number of methods that are well known to those of ordinary skill in the art. For example, one can deposit nitride layer 1050 by use of well known PCVD silicon nitride deposition processes. Nitride layer 1050 can be about one micron (1 µm) thick, or it may be any other thickness that is suitable for, and compatible with, subsequent processing as described below (which other thicknesses may be determined readily by one of ordinary skill in the art without undue experimentation). Alternatively, if stresses produced in such a thick nitride need to be relieved, nitride layer 1050 may be fabricated using nitride layers interspersed with, for example, and without limitation, one or more silicon oxide layers. In such a case, in accordance with some embodiments, nitride layer 1050 may be comprised of about 2000 Å to about 3000 Å thick nitride layers abutting oxide layers of sufficient thickness to produce the appropriate stress relief (appropriate thicknesses of nitride and/or abutting oxide layers may be determined readily by one of ordinary skill in the art without undue experimentation). For example, such an embodiment may be formed using LPCVD processes that are well known to those of ordinary skill in the art. Lastly, layer 1060 comprises a PR layer that is deposited and patterned in accordance with any one of a number of methods that are well known to those of ordinary skill in the art. The width of PR layer 1060 is determined by the width of the gate and its spacing from a source and drain in a structure fabricated in accordance with one or more embodiments of the present invention, and as will be described in detail below.

Figure 2:
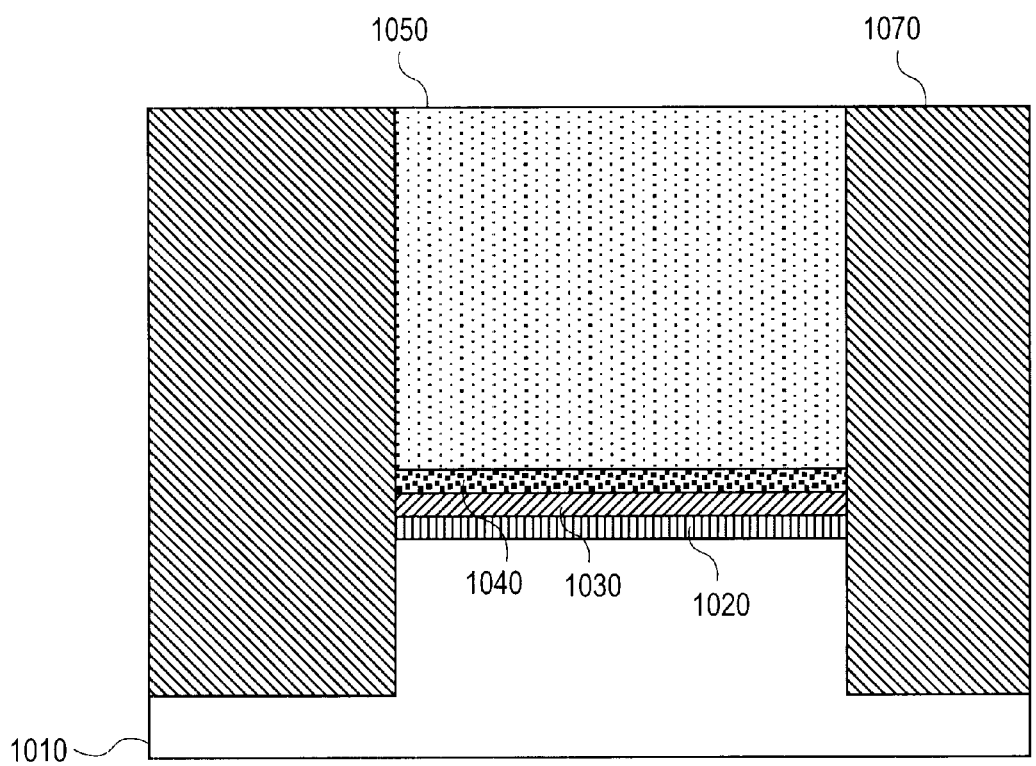
FIG. 2 shows a block diagram of a cross section of the structure shown FIG. 1 after it has been processed in accordance with one or more embodiments of the present invention to form device isolation structures.

FIG. 2 shows a block diagram of a cross section of structure 1000 shown in FIG. 1 after it has been processed in accordance with one or more embodiments of the quasi-damascene gate, self-aligned source/drain processes of the present invention to form device isolation structures. In particular, FIG. 2 shows structure 1000 after it has been etched in accordance with one or more methods that are well known to those of ordinary skill in the art to enable shallow trench isolation ("STI") structures to be formed. This etch step is carried out to etch through self-aligning layer 1050 (for example, nitride layer 1050), protection layer 1040 (for example, oxide layer 1040), layer 1030, gate dielectric layer 1020, and partially through silicon substrate 1010. Next, as shown in FIG. 2, STI structures 1070 are formed in accordance with any one of a number of methods that are well known to those of ordinary skill in the art. For example, one can form STI structures 1070 by use of a high density plasma chemical vapor deposition (HDP-CVD) oxide fill process or a subatmospheric chemical vapor deposition oxide (SACVD) fill process to deposit STI structures comprised of silicon oxide. Lastly, the resulting structure may be processed by any one or a number of processes that are well known to those of ordinary skill in the art to planarize the structure approximately to the top of nitride layer 1050. For example, one can planarize the structure by use of a chemical mechanical planarization ("CMP") process.

Figure 3:
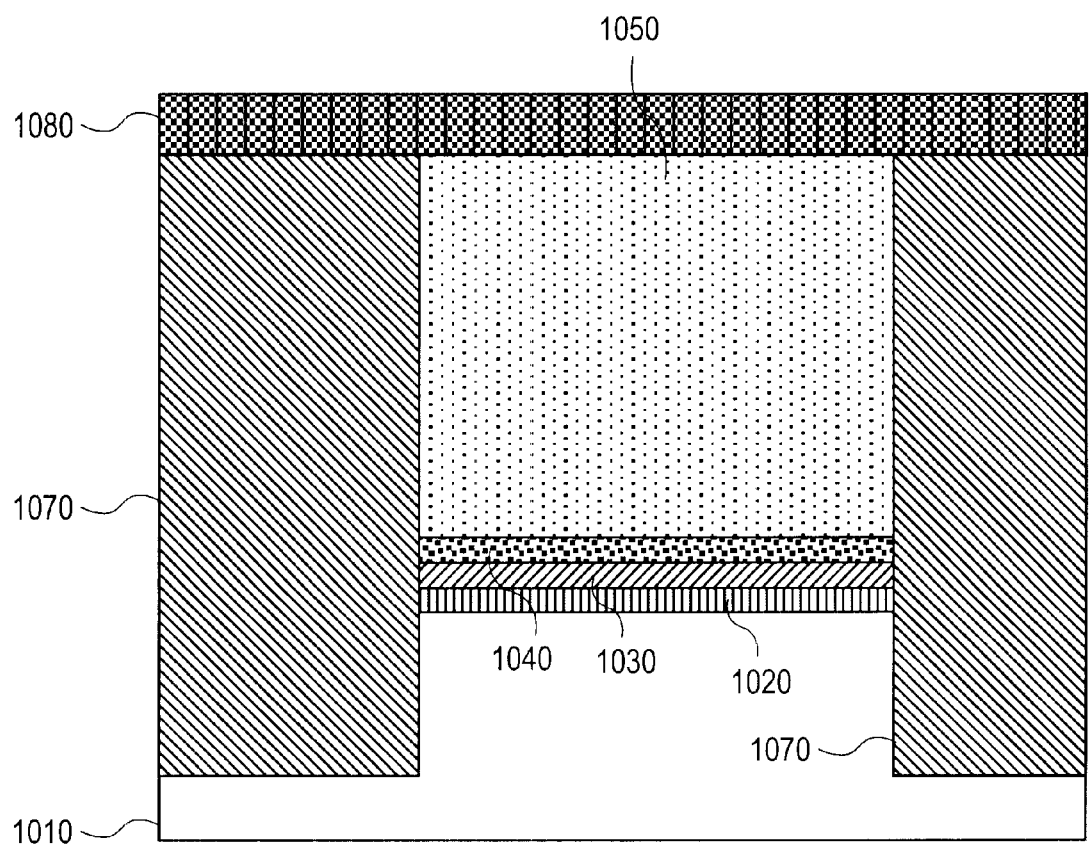
FIG. 3 shows a block diagram of a cross section of the structure shown in FIG. 2 after it has been processed in accordance with one or more embodiments of the present invention to form a hardmask thereon.

FIGS. 3–6 show block diagrams of cross sections of structures after they have been processed in accordance with one or more embodiments of the present invention to form a mask that defines gate electrode dimensions less than 0.13 μm. In particular, FIG. 3 shows a block diagram of a cross section of structure 1000 shown in FIG. 2 after it has been processed in accordance with one or more embodiments of the quasi-damascene gate, self-aligned source/drain processes of the present invention to form a hardmask for self-aligning layer 1050 (for example, nitride layer 1050) thereover. Hardmask layer 1080 shown in FIG. 3 is formed in accordance with any one of a number of methods that are well known to those of ordinary skill in the art. For example, one can deposit hardmask layer 1080 as a polysilicon layer. In such a case, in accordance with some embodiments, polysilicon hardmask layer 1080 may be about 800 Å, or it may be any other thickness that is suitable for, and compatible with, subsequent processing as described below (which other thicknesses may be determined readily by one of ordinary skill in the art without undue experimentation). As one of many alternatives, hardmask layer 1080 may be formed using a chemical vapor deposition, carbon antireflective coating process developed by Applied Materials, Inc. of Santa Clara, Calif.

Figure 4:
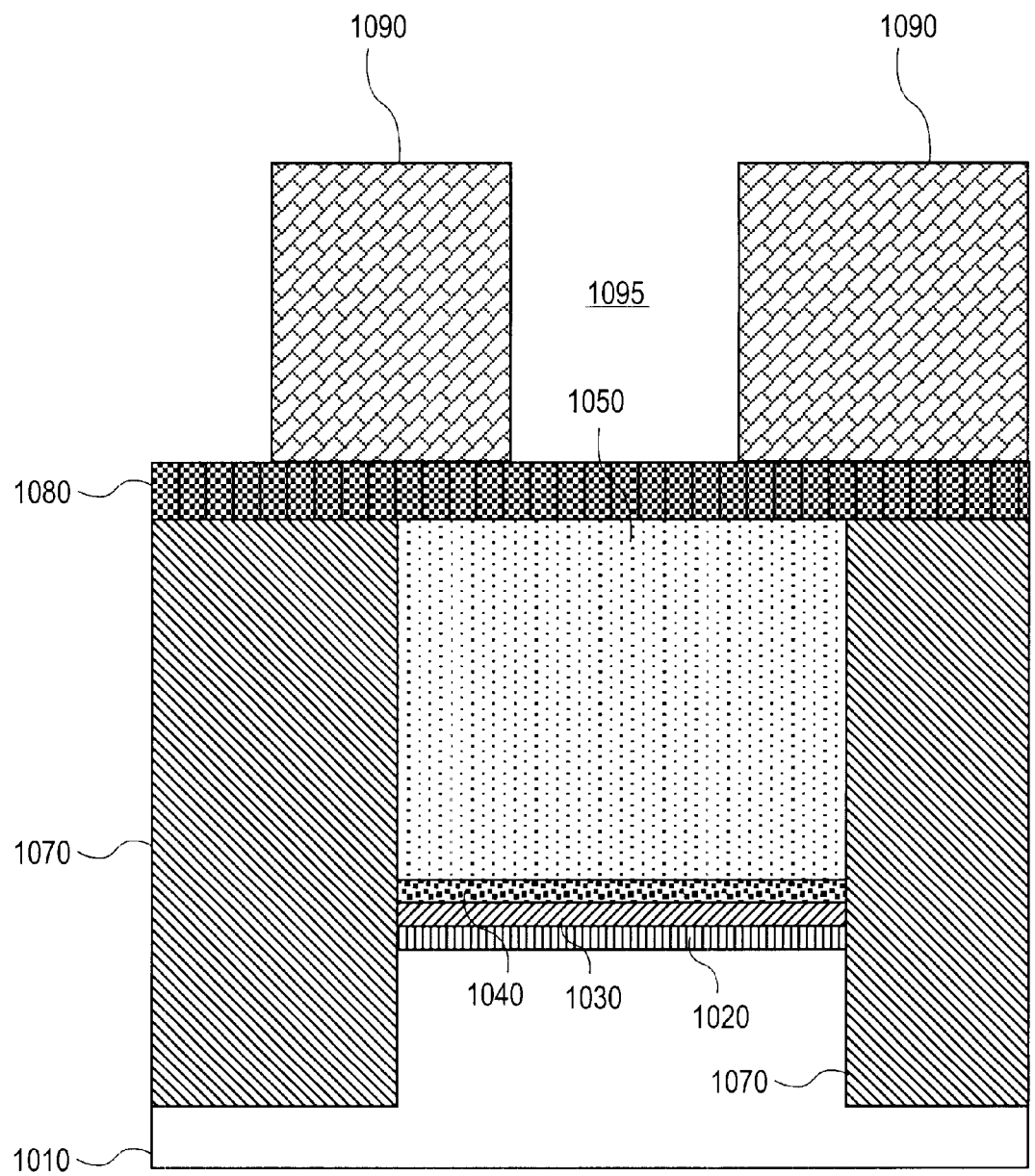
FIG. 4 shows a block diagram of a cross section of the structure shown in FIG. 3 after it has been processed in accordance with one or more embodiments of the present invention to form a photoresist layer thereon.

FIG. 4 shows a block diagram of a cross section of structure 1000 shown in FIG. 3 after it has been processed in accordance with one or more embodiments of the damascene gate processes of the present invention to form photoresist layer 1090 ("PR layer 1090") thereover. PR layer 1090 is deposited and patterned in accordance with anyone of a number of methods that are well known to those of ordinary skill in the art. The width of opening 1095 in PR layer 1090 is determined by the width of the gate in a structure fabricated in accordance with one or more embodiments of the present invention, and as will be described in detail below.

Figure 5:
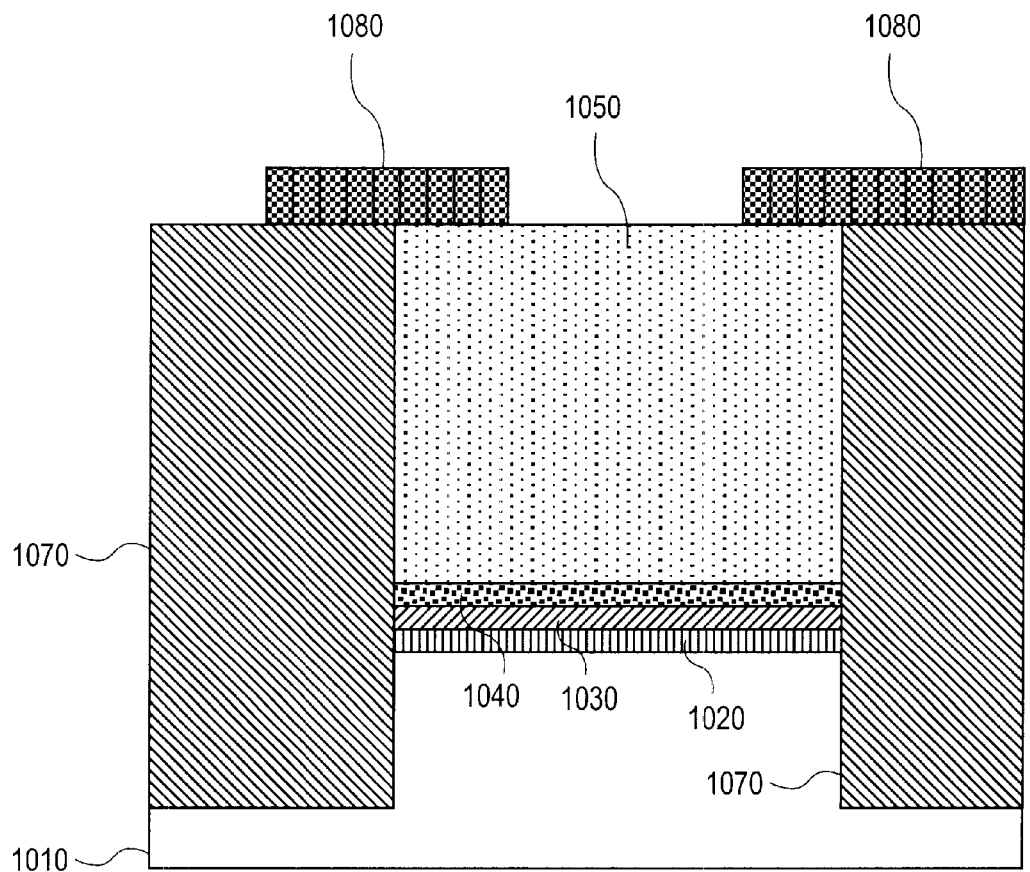
FIG. 5 shows a block diagram of a cross section of the structure shown in FIG. 4 after it has been processed in accordance with one or more embodiments of the present invention to pattern a hardmask layer formed thereon.

FIG. 5 shows a block diagram of a cross section of structure 1000 shown in FIG. 4 after it has been processed in accordance with one or more embodiments of the quasi-damascene gate, self-aligned source/drain processes of the present invention to pattern hardmask layer 1080, for example, by etching. Hardmask layer 1080 may be etched in accordance with any one of a number of methods that are well known to those of ordinary skill in the art, and PR layer 1090 may then be stripped in accordance with anyone of a number of methods that are well known to those of ordinary skill in the art.

Figure 6:
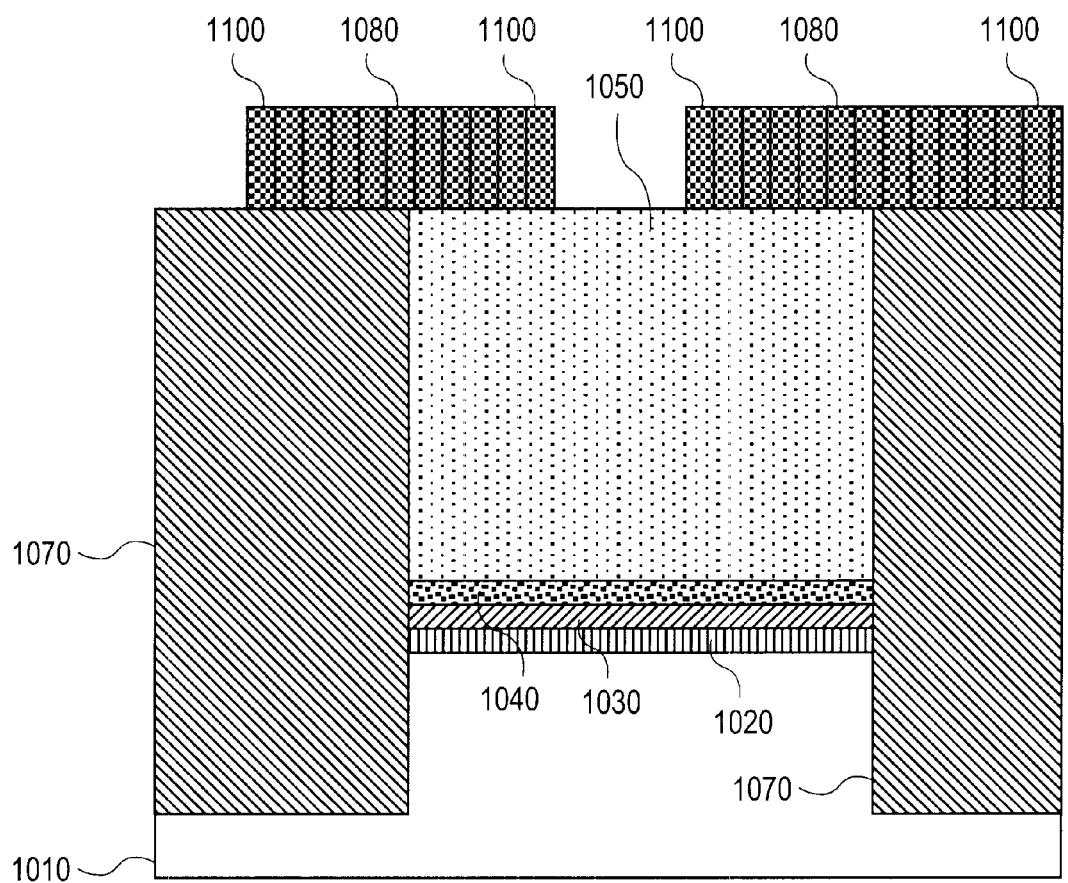
FIG. 6 shows a block diagram of a cross section of the structure shown in FIG. 5 after it has been processed in accordance with one or more embodiments of the present invention to form spacers thereon.

FIG. 6 shows a block diagram of a cross section of structure 1000 shown in FIG. 5 after it has been processed in accordance with one or more embodiments of the quasi-damascene gate, self-aligned source/drain processes of the present invention to form spacers 1100 thereon. As shown in FIG. 6, hardmask spacers 1100 are formed over hardmask layer 1080 in accordance with any one of a number of methods that are well known to those of ordinary skill in the art. For example, one can form spacers 100 by depositing a polysilicon layer in accordance with any one of a number of methods that are well known to those of ordinary skill in the art. As one example, one can deposit polysilicon spacers in an LPCVD process, and as is well known, such a process is highly conformal. Then, the deposited polysilicon is etched anisotropically, for example, using a plasma polysilicon etch process that is well known to those of ordinary skill in the art to open nitride layer 1050 and filled oxide 1070. In accordance with this embodiment of the present invention, spacers 1100 provide several advantages. One reason to utilize spacers 1100 is to overcome limitations of photolithography equipment that cannot reliably produce small gates, i.e., gates having widths below 0.13 μm (1300 Å). By depositing 100 Å of polysilicon, the gate width may be reduced by 200 Å to 1100 Å, by depositing 200 Å of polysilicon, the gate width may be reduced by 400 Å to 900 Å, and so on. Another reason to utilize spacers 1100 is to protect the edges of nitride layer 1050 in a subsequent etch to be described below.

Figure 7:
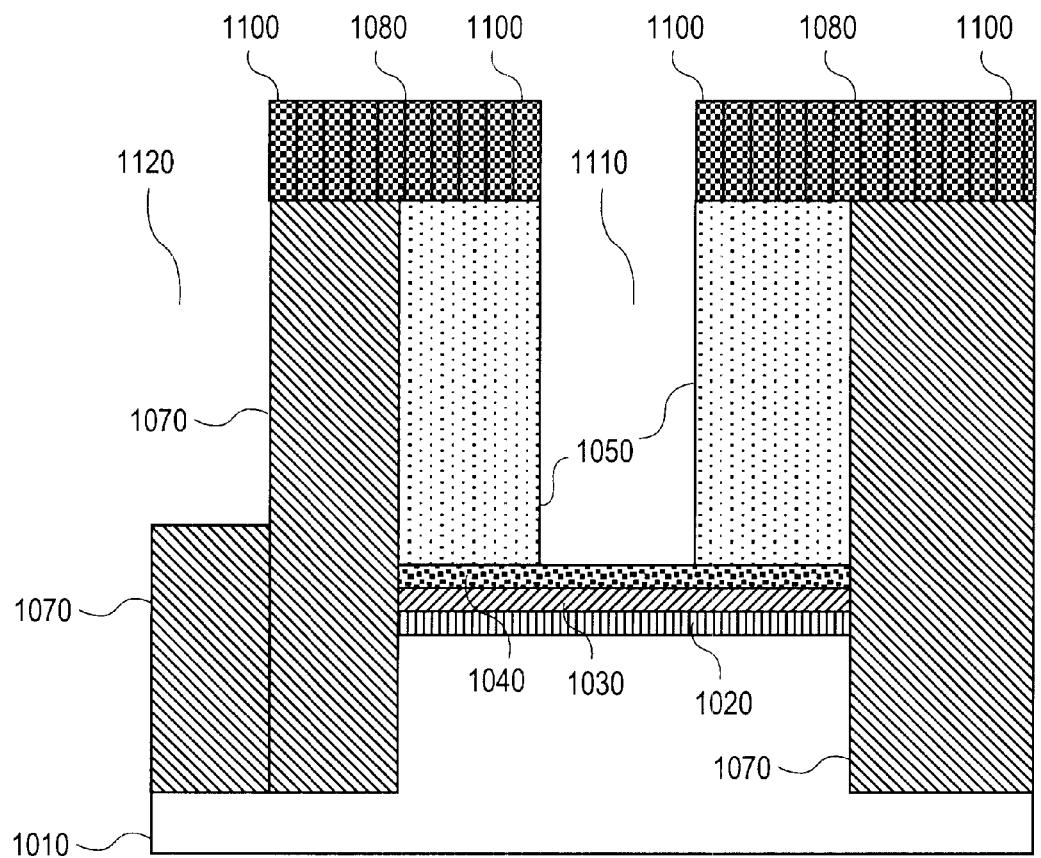
FIG. 7 shows a block diagram of a cross section of the structure shown in FIG. 6 after it has been processed in accordance with one or more embodiments of the present invention to form an aperture in a "self-aligning" layer.

FIG. 7 shows a block diagram of a cross section of structure 1000 shown in FIG. 6 after it has been processed in accordance with one or more embodiments of the quasi-damascene gate, self-aligned source/drain processes of the present invention to remove a portion of nitride layer 1050, for example, by etching, to form aperture 1110 therein without using the first gate electrode layer 1030 (for example, polysilicon) as an etch stop. Step 1 of a suitable etch process is performed in accordance with any one or a number of methods that are well known to those of ordinary skill in the art. For example, one can perform this step of the suitable etch process by performing a plasma dielectric recess etch with a nitride-to-oxide etch selectivity of greater than, or about equal to, 1. One can use an interferometric end point methodology such as that available from Applied Materials, Inc. of Santa Clara, Calif. ("IEP") to endpoint this etch process step prior to reaching oxide layer 1040. This will enable the etch process to proceed at a relatively rapid rate. Step 2 of the suitable etch process is performed in accordance with any one or a number of methods that are well known to those of ordinary skill in the art using a nitride-to-oxide selectivity that will stop the etch on oxide layer 1040 to provide the structure shown in FIG. 7. Note that the etch processes performed to produce the structure shown in FIG. 7 should be adjusted so that STI structure 1070 under aperture 1120 is higher than layer 1030. If STI oxide 1070 under aperture 1120 were lower than layer 1030, layer 1040 might be exposed to potential damage in further etch steps.

Figure 8:
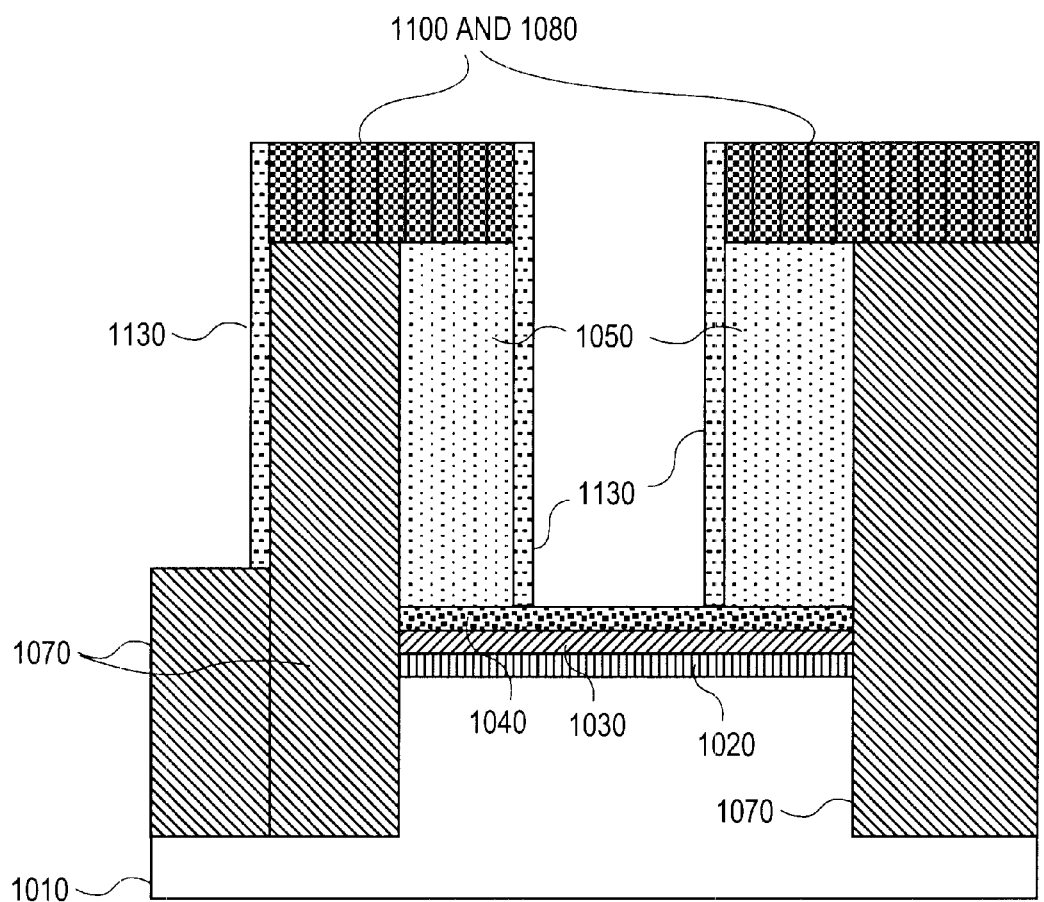
FIG. 8 shows a block diagram of a cross section of the structure shown in FIG. 7 after it has been processed in accordance with one or more embodiments of the present invention to form a thin oxide layer over the self-aligning layer.

FIG. 8 shows a block diagram of a cross section of structure 1000 shown in FIG. 7 after it has been processed in accordance with one or more embodiments of the quasi-damascene gate, self-aligned source/drain processes of the present invention to form thin oxide layer 1130 over nitride layer 1050. As will described below, thin oxide layer 1130 facilitates wet etching of nitride layer 1050 to help define contact holes. As shown in FIG. 8, thin oxide layer 1130 is formed over nitride 1030 in accordance with any one of a number of methods that are well known to those of ordinary skill in the art. For example, in one embodiment, thin oxide layer 1130 comprises from about 30 Å to about 40 Å of oxide that is grown by exposing the structure to oxygen or that is deposited by an LPCVD oxide process. Advantageously, oxide layer 1130 protects polysilicon layer 1140 (refer to FIG. 10) when nitride layer 1050 is wet etched (refer to FIG. 13).

Figure 9:
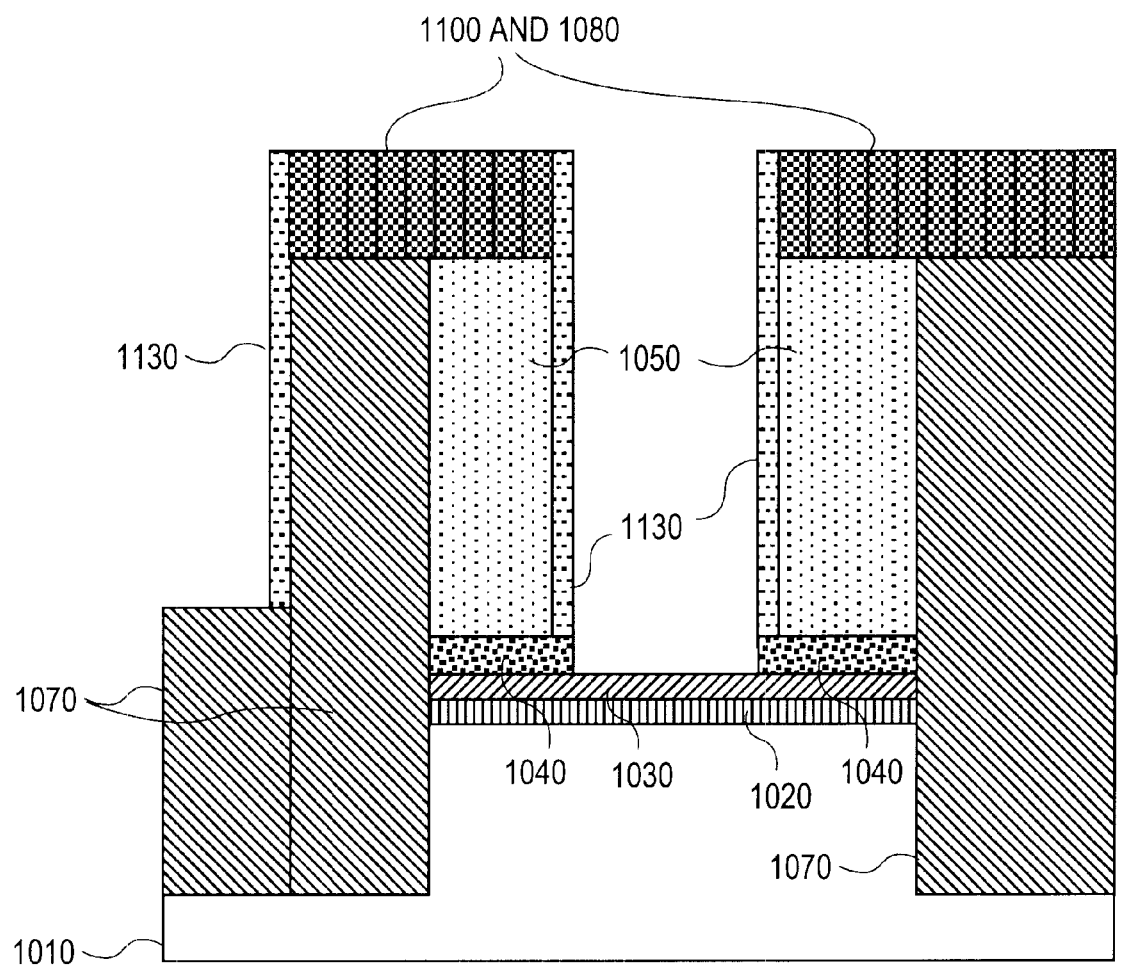
FIG. 9 shows a block diagram of a cross section of the structure shown in FIG. 8 after it has been processed in accordance with one or more embodiments of the present invention to remove a portion of a contact etch stop layer over a first gate electrode layer.

FIG. 9 shows a block diagram of a cross section of structure 1000 shown in FIG. 8 after it has been processed in accordance with one or more embodiments of the damascene gate processes of the present invention to remove a portion of contact etch stop layer 1040 (for example, oxide layer 1040), for example, by etching. Oxide layer 1040 is etched in accordance with any one of a number of methods that are well known to those of ordinary skill in the art, which etch stops on layer 1030 (for example, polysilicon layer 1030).

Figure 10:
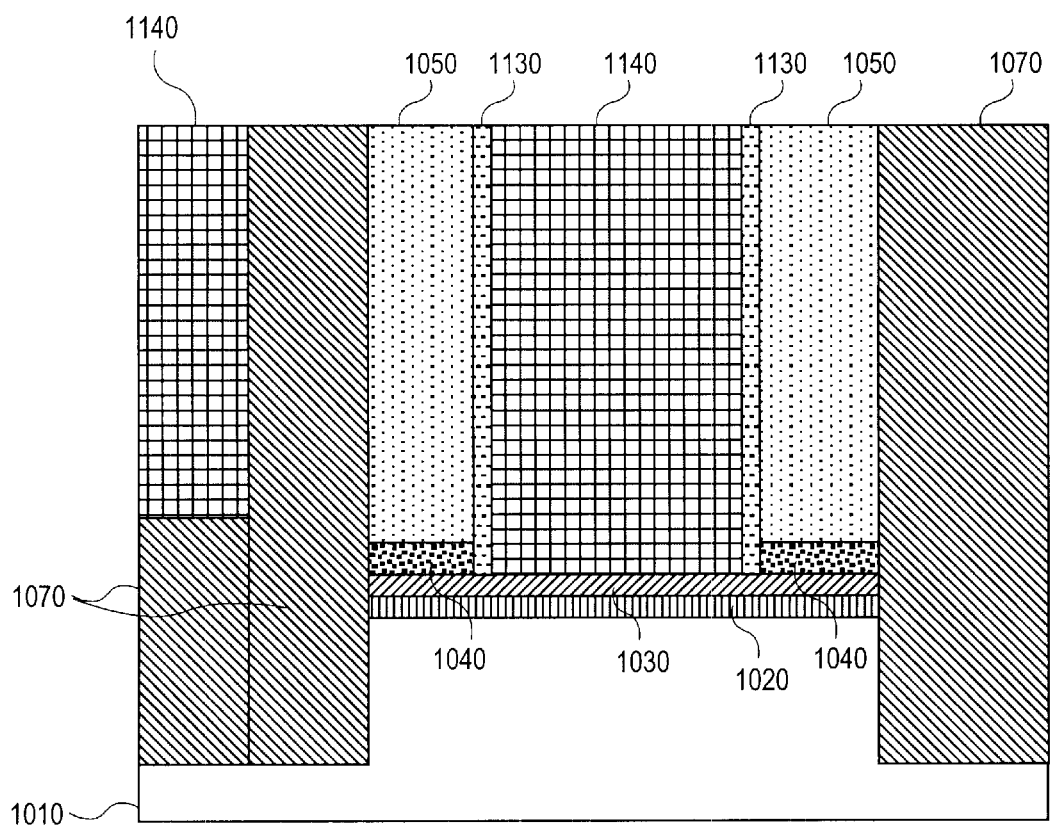
FIG. 10 shows a block diagram of a cross section of the structure shown in FIG. 9 after it has been processed in accordance with one or more embodiments of the present invention to form a second gate electrode layer on the first gate electrode layer.

FIG. 10 shows a block diagram of a cross section of structure 1000 shown in FIG. 9 after it has been processed in accordance with one or more embodiments of the quasi-damascene gate, self-aligned source/drain processes of the present invention to form second gate electrode layer 1140 over first gate electrode layer 1030 without having to etch second gate electrode layer 1140 to define the gate electrode width. Second gate electrode layer 1140 can be polysilicon, W, SiGe, or any other material or materials used to fabricate a gate electrode (for example, and without limitation, a silicide such as a refractory silicide—such as cobalt silicide). Note that gate electrode layer 1140 is not deposited over areas where sources and drains will be formed. Gate electrode layer 1140 is deposited in accordance with any one of a number of methods that are well known to those of ordinary skill in the art. Next, the resulting structure may be processed by any one of a number of processes that are well known to those of ordinary skill in the art to planarize the structure approximately to the top of nitride layer 1050. For example, one can planarize the structure by use of a CMP process. Next, gate electrode layer 1140 covering gate electrode layer 1030 may be doped (for example, p-doped or n-doped) in accordance with any one of a number of methods that are well known to those of ordinary skill in the art such as by applying appropriate masks, exposing the structure to doping by ion implantation, and then removing the masks. In addition, in accordance with some embodiments, some devices on the structure may be p-doped, and others may be n-doped. In any event, after the doping step, the masks are stripped to provide the structure shown in FIG. 10.

Figure 11:
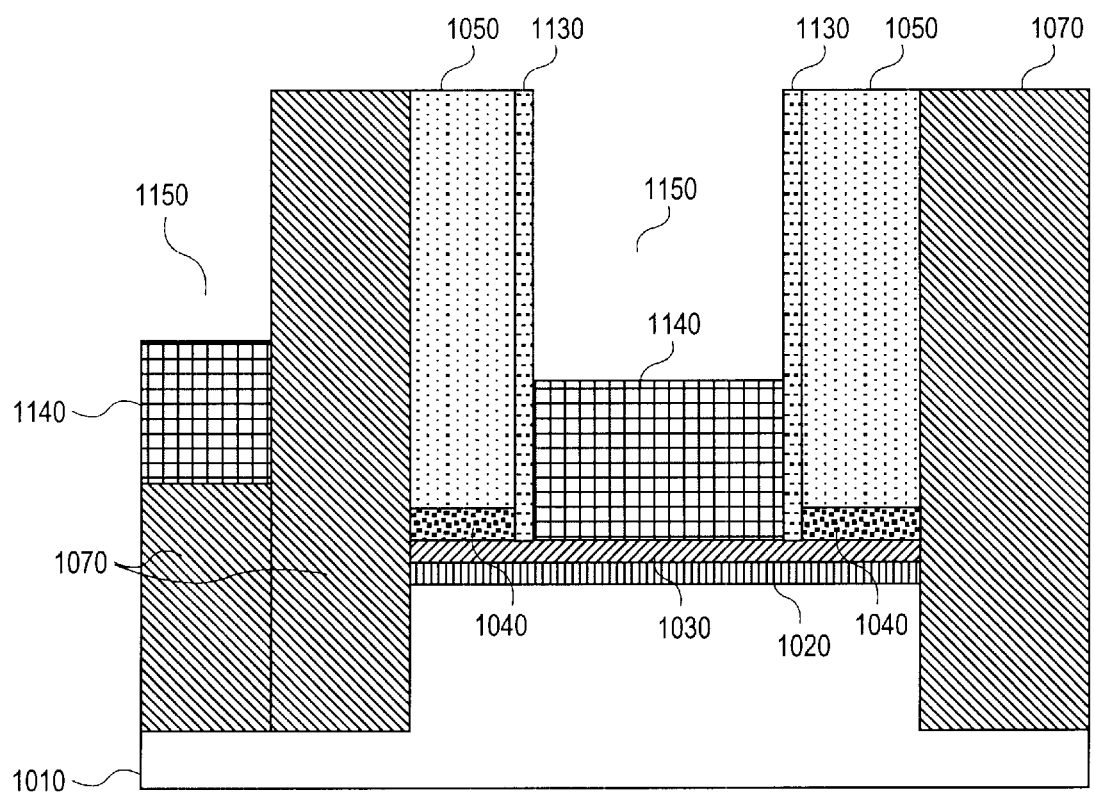
FIG. 11 shows a block diagram of a cross section of the structure shown in FIG. 10 after it has been processed in accordance with one or more embodiments of the present invention to etch a portion of the second gate electrode layer.

FIG. 11 shows a block diagram of a cross section of structure 1000 shown in FIG. 10 after has been is processed in accordance with one or more embodiments of the quasi-damascene gate, self-aligned source/drain processes of the present invention to remove a portion of layer 1140, for example, by etching, to form recesses 1150. Layer 1140 is etched in accordance with any one of a number of methods that are well known to those of ordinary skill in the art. For example, one can perform the etch process by performing a plasma recess etch using IEP to endpoint this etch process step. This will enable the etch process to proceed at a relatively rapid rate. After this step, the total polysilicon thickness (i.e., for an embodiment wherein layer 1030 and layer 1140 comprise polysilicon) may be about 2000 Å. However, thicknesses may vary depending upon the particular device being formed (suitable thicknesses may be determined readily by one of ordinary skill in the art without undue experimentation).

Figure 12:
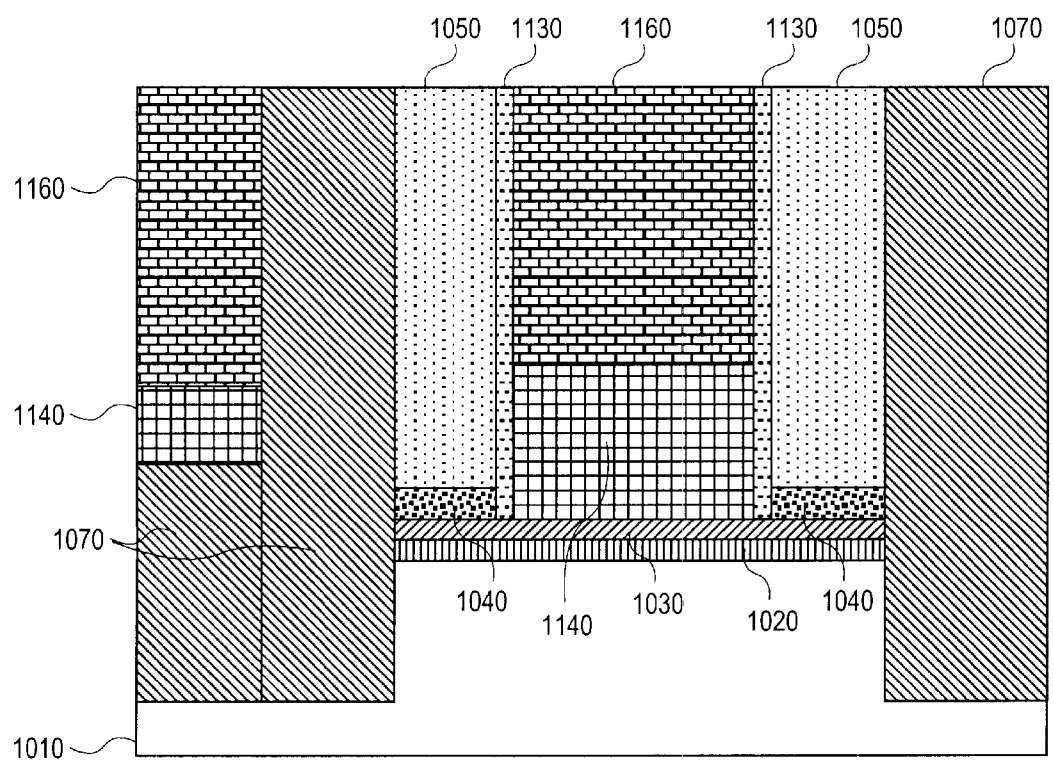
FIG. 12 shows a block diagram of a cross section of the structure shown in FIG. 11 after it has been processed in accordance with one or more embodiments of the present invention to fill recesses formed by the previous etch step.

FIG. 12 shows a block diagram of a cross section of structure 1000 shown in FIG. 11 after it has been processed in accordance with one or more embodiments of the damascene gate processes of the present invention to fill recesses 1150 formed by the previous etch step. For example, in one embodiment, oxide layer 1160 is formed to fill recesses 1150 formed by the etch step described above in conjunction with FIG. 11. Oxide layer 1160 may be formed in accordance with any one of a number of methods that are well known to those of ordinary skill in the art. For example, one may deposit oxide layer 1160 using a PCVD process which utilizes TEOS and $O_2$ as precursors. Next, the resulting structure may be processed by any one or a number of processes that are well known to those of ordinary skill in the art to planarize the structure approximately to the top of nitride layer 1050. For example, one can planarize the structure by use of a CMP process.

Next, a contact hole (not shown) is opened to layer 1140. For example, opening the contact hole is performed by conventional PR masking and etching processes.

Figure 13:
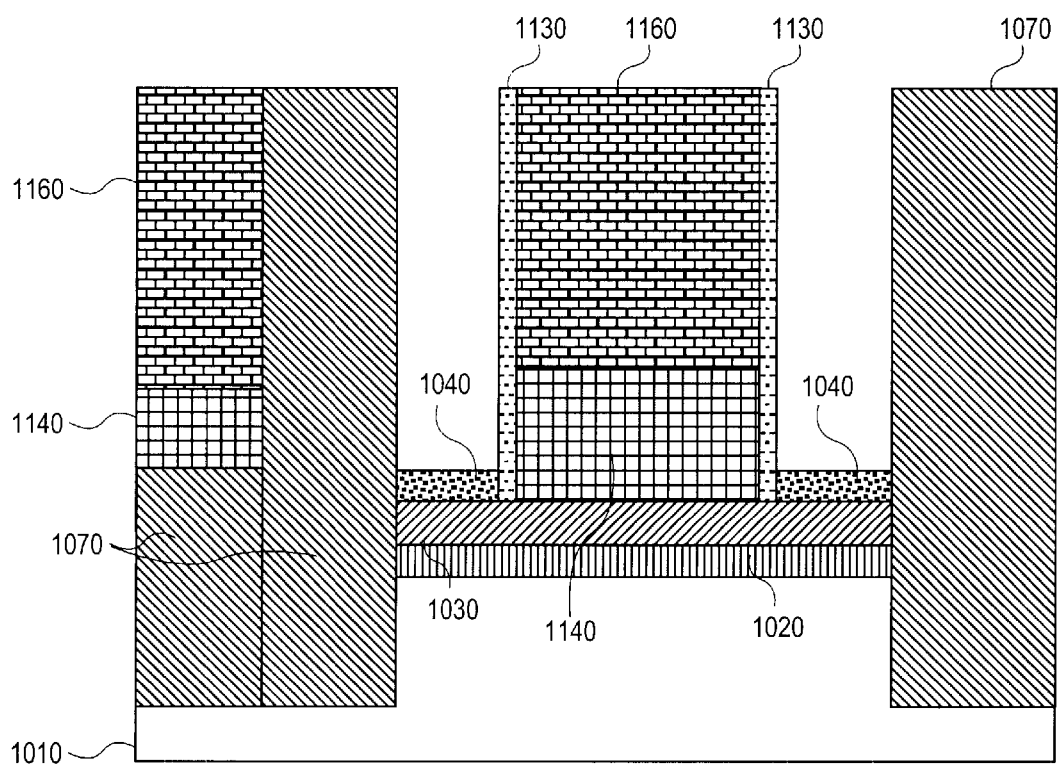
FIG. 13 shows a block diagram of a cross section of the structure shown in FIG. 12 after it has been processed in accordance with one or more embodiments of the present invention to remove the self-aligning layer and define contact holes for the source and drain.

FIG. 13 shows a block diagram of a cross section of structure 1000 shown in FIG. 12 after it has been processed in accordance with one or more embodiments of the damascene gate processes of the present invention to remove nitride layer 1050 (that appears in FIG. 14) and define contact holes for the source and drain. Nitride layer 1050 (that appears in FIG. 14) may be removed by an etch process that is performed in accordance with any one or a number of methods that are well known to those of ordinary skill in the art. In accordance with one or more such embodiments, nitride layer 1050 is removed by a wet etch. For example, one can perform the wet etch step by performing a wet etch with hot $H_3PO_4$, where contact etch stop layer 1040 acts as an etch stop for this wet etch. Advantageously, the wet etch provides a smooth profile with no undercutting.

Figure 14:
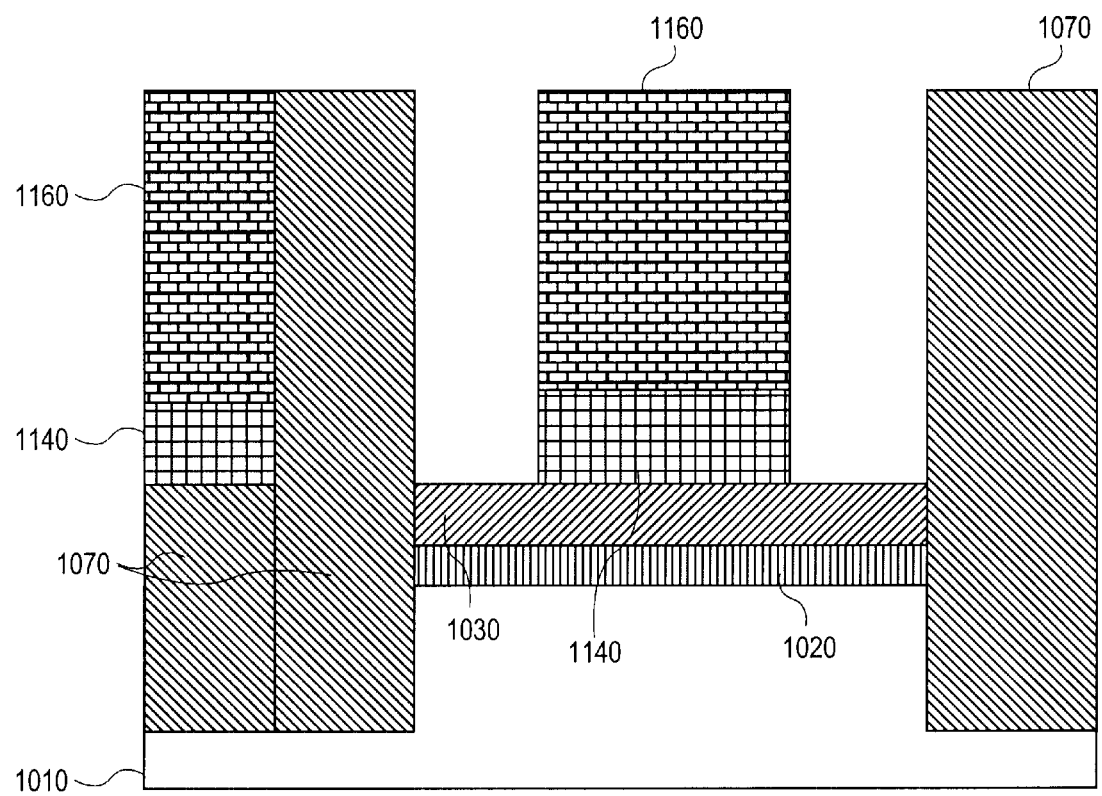
FIG. 14 shows a block diagram of a cross section of the structure shown in FIG. 13 after it has been processed in accordance with one or more embodiments of the present invention to remove a contact etch stop layer and a first gate electrode layer.

FIG. 14 shows a block diagram of a cross section of structure 1000 shown in FIG. 13 after it has been processed in accordance with one or more embodiments of the quasi-damascene gate, self-aligned source/drain processes of the present invention to remove, for example, by etching, oxide layer 1040 and layer 1030. Oxide layer 1040 and layer 1030 are etched in accordance with any one of a number of methods that are well known to those of ordinary skill in the art. For example, if layer 1030 is comprised of polysilicon, one can etch this layer by performing an "overetch" plasma poly etch, wherein an overetch plasma poly etch may be performed in accordance with any one of a number of methods that are well known to those of ordinary skill in the art by using an etch recipe engineered to stop on gate oxide layer 1020. Note that oxide layer 1160 acts as a "hardmask" for this step. If layer 1030 is comprised of other materials such as, for example, SiGe, it can similarly be etched using an "overetch" plasma etch. Advantageously, in accordance with these embodiments, the source and drain areas of a device are self-aligned with respect to the gate electrode formed as remaining portions of layers 1030 and 1140. Also note that, because layer 1030 does not comprise the total thickness of the gate electrode, the time that gate oxide layer 1020 is exposed to a plasma environment is reduced. Further, because the "overetch" step has high selectivity-to-oxide, the chance of punching through the oxide is reduced.

Figure 15:
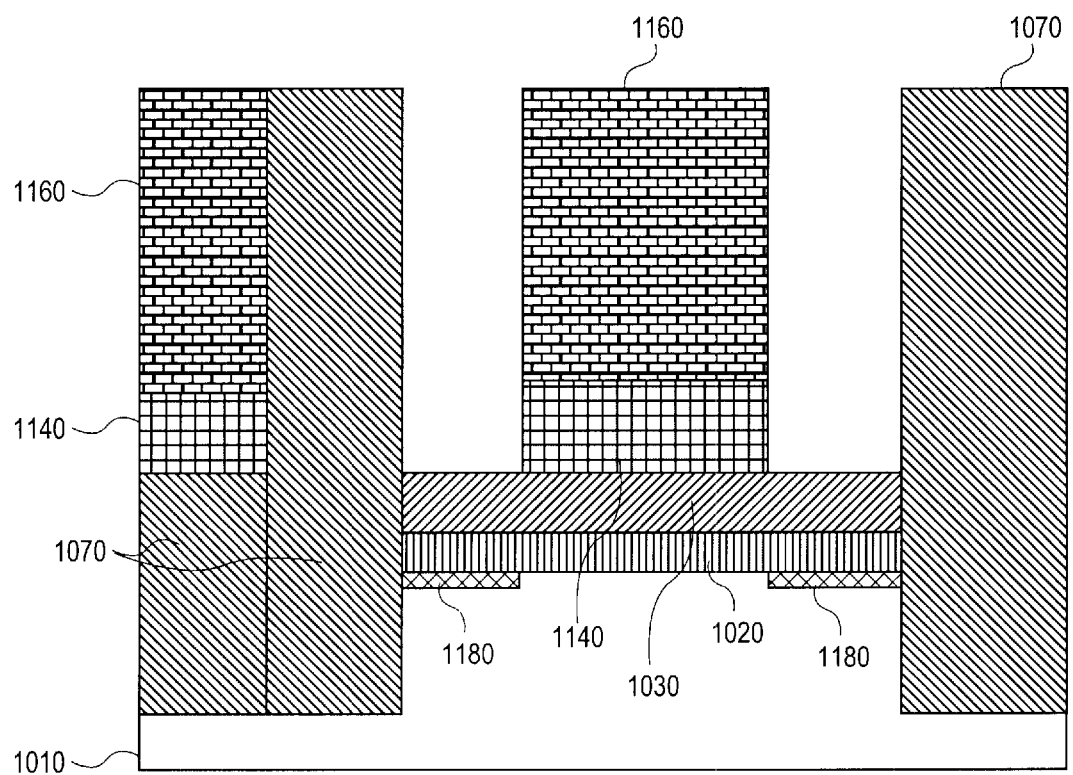
FIG. 15 shows a block diagram of a cross section of the structure shown in FIG. 14 after it has been processed in accordance with one or more embodiments of the present invention to implant source and drain areas.

FIG. 15 shows a block diagram of a cross section of structure 1000 shown in FIG. 14 after it has been processed in accordance with one or more embodiments of the quasi-damascene gate, self-aligned source/drain processes of the present invention to implant source and drain areas 1180. Source and drain areas 1180 are implanted in accordance with any one of a number of methods that are well known to those of ordinary skill in the art.

Figure 16:
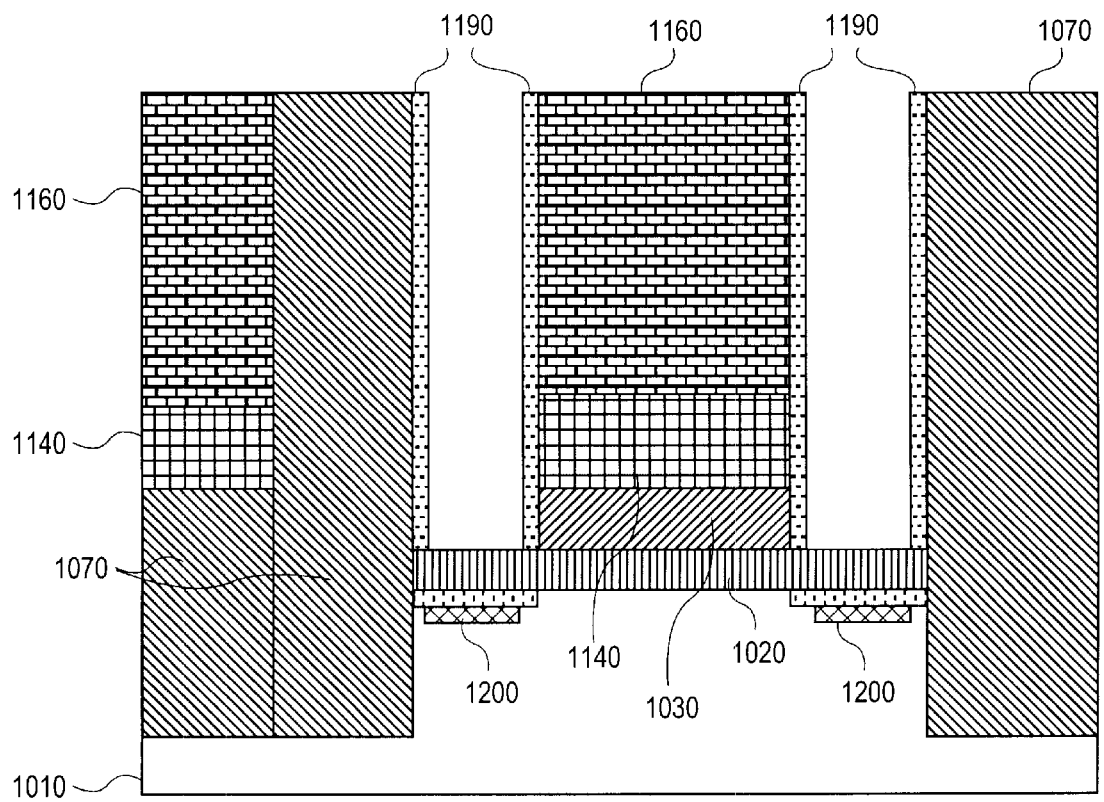
FIG. 16 shows a block diagram of a cross section of the structure shown in FIG. 15 after it has been processed in accordance with one or more embodiments of the present invention to form spacers and to form lightly doped drain ("LDD") areas.

FIG. 16 shows a block diagram of a cross section of structure 1000 shown in FIG. 15 after it has been processed in accordance with one or more embodiments of the quasi-damascene gate, self-aligned source/drain processes of the present invention to form spacers 1190, and to form lightly doped drain ("LDD") areas 1200. Spacers 1190 and LDD 1200 may be formed in accordance with any one of a number of methods that are well known to those of ordinary skill in the art. Advantageously, spacers 1190 enable the distance between the source/drain and the gate of the device to be substantially equal to that required by the device design.

Figure 17:
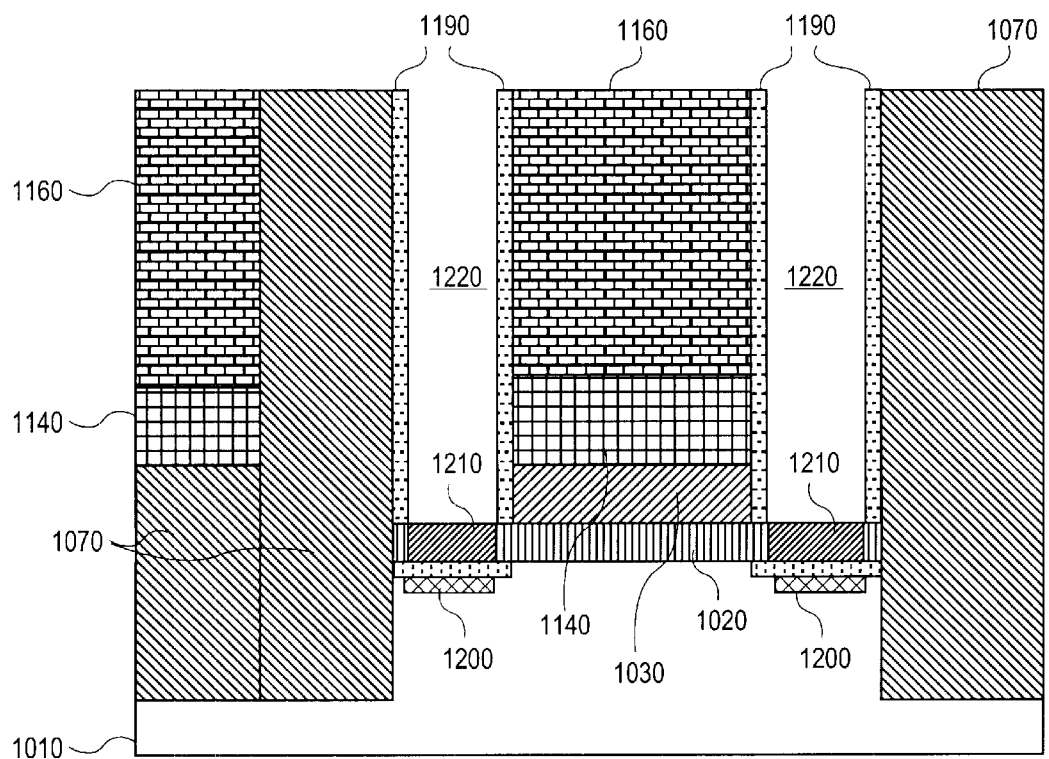
FIG. 17 shows a block diagram of a cross section of the structure shown in FIG. 16 after it has been processed in accordance with one or more embodiments of the present invention to etch a gate oxide layer from the source and drain areas, and to form a silicide over the source and drain.

FIG. 17 shows a block diagram of a cross section of structure 1000 after it has been processed in accordance with one or more embodiments of the quasi-damascene gate, self-aligned source/drain processes of the present invention to form source and drain contacts, wherein the contacts are not subjected to plasma etch processes after formation. In particular, FIG. 17 shows a block diagram of a cross section of structure 1000 shown in FIG. 16 after it has been processed in accordance with one or more embodiments of the present invention to remove, for example, by etching, gate oxide layer 1020 from the source and drain, and to form a silicide over the source and drain. Advantageously, in accordance with one or more embodiments of the present invention, gate oxide 1020 is wet etched in accordance with any one of a number of methods that are well known to those of ordinary skill in the art, for example, using an HF solution. Next, silicide layers 1210 are formed in accordance with any one of a number of methods that are well known to those of ordinary skill in the art. For example, silicide layers 1210 are formed by depositing titanium ("Ti") on the structure, and heating it to about 500° C. As is known, silicide will form wherever it comes in contact with silicon. Then, the structure can be dipped, for example, $H_2O_2$ to remove any unreacted Ti, and annealed, for example, at a higher temperature.

Figure 18:
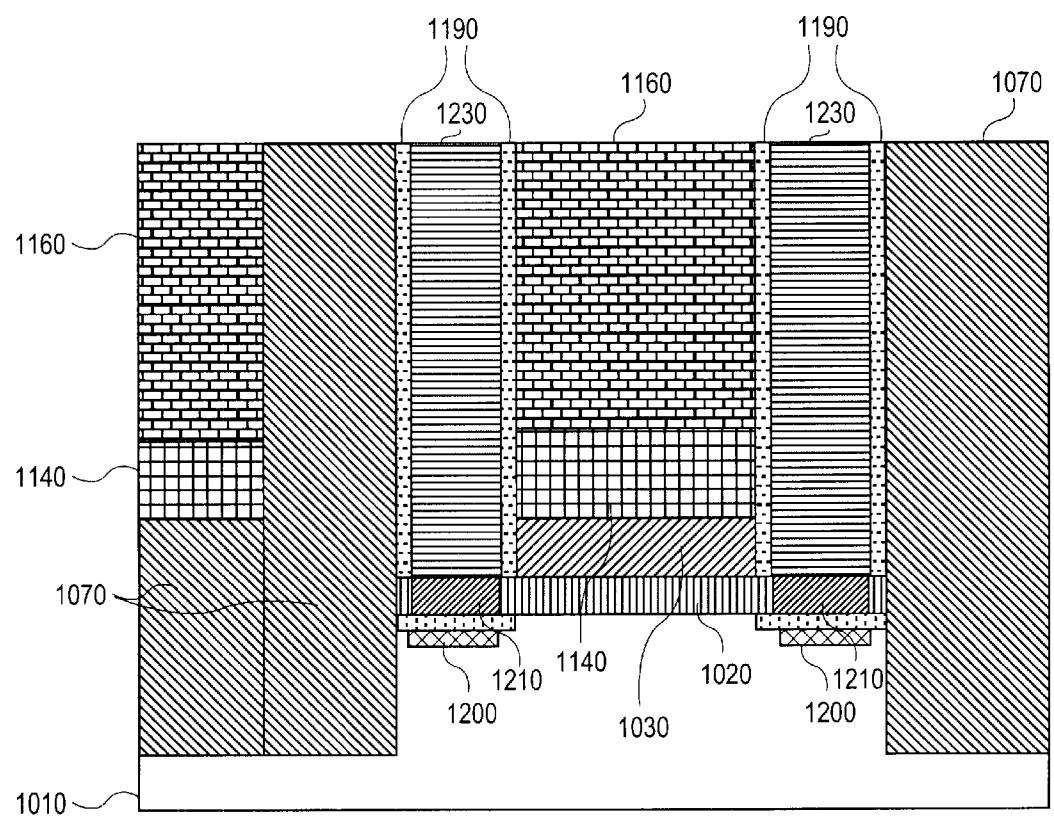
FIG. 18 shows a block diagram of a cross section of the structure shown in FIG. 17 after it has been processed in accordance with one or more embodiments of the present invention to fill source and drain contact apertures with a conductor material.

FIG. 18 shows a block diagram of a cross section of structure 1000 shown in FIG. 17 after it has been processed in accordance with one or more embodiments of the dama- scene gate processes of the present invention to fill source and drain contact apertures 1220 with a conductor material. Conductors 1230 are deposited in accordance with any one of a number of methods that are well known to those of ordinary skill in the art. For example, conductors 1230 may be formed from W or from copper (Cu). As is well known, deposition processes that deposit a metal may also entail depositing adhesion and barrier layers prior to depositing the metal. Finally, the resulting structure may be processed by any one or a number of processes that are well known to those of ordinary skill in the art to planarize the structure. For example, one can planarize the structure by use of a CMP process.

As one of ordinary skill in the art can readily appreciate, the structure fabricated in accordance with the above-described embodiments of the present invention is now ready for application of a "metal 1" layer of conductors to be applied thereto.

Those skilled in the art will recognize that the foregoing description has been presented for the sake of illustration and description only. As such, it is not intended to be exhaustive or to limit the invention to the precise form disclosed. For example, although certain dimensions were discussed above, they are merely illustrative since various designs may be fabricated using the embodiments described above, and the actual dimensions for such designs will be determined in accordance with circuit requirements.

What is claimed is:

1. A quasi-damascene gate, self-aligned source/drain method for forming a device on a substrate that comprises steps of:

forming a gate dielectric layer over the substrate;

forming a first gate electrode layer over the gate dielectric layer;

forming a contact etch stop layer over the first gate electrode layer;

forming a self-aligning layer over the contact etch stop layer comprising an oxide layer; and forming and patterning a mask over the self-aligning layer.

2. The quasi-damascene gate, self-aligned source/drain method of claim 1 wherein the step of forming a self-aligning layer comprises forming a nitride layer.

3. The quasi-damascene gate, self-aligned source/drain method of claim 2 wherein the step of forming a nitride layer comprises forming a thick nitride layer.

4. The quasi-damascene gate, self-aligned source/drain method of claim 3 wherein the step of forming a nitride layer comprises forming nitride layers abutting oxide layers.

5. The quasi-damascene gate, self-aligned source/drain method of claim 1 wherein:

the step of forming a gate dielectric layer comprises forming a gate oxide; and the step of forming a first gate electrode layer comprises forming a polysilicon layer.

6. The quasi-damascene gate, self-aligned source/drain method of claim 1 wherein the step of forming a first gate electrode layer comprises forming a silicon-germanium layer.

7. The quasi-damascene gate, self-aligned source/drain method of claim 1 which further comprises steps of:

forming isolation structures.

8. The quasi-damascene gate, self-aligned source/drain method of claim 7 wherein the step of forming isolation structures comprises forming shallow trench isolation ("STI") structures.

9. The quasi-damascene gate, self-aligned source/drain method of claim 8 wherein the step of forming STI structures comprises steps of:

etching the self-aligning layer, the contact etch stop layer, the first gate electrode layer, the gate dielectric layer, and the substrate;

depositing oxide to form the STI structures; and planarizing to a top of the self-aligning layer.

10. The quasi-damascene gate, self-aligned source/drain method of claim 8 which further comprises steps of:

forming a hardmask layer over the self-aligning layer.

11. The quasi-damascene gate, self-aligned source/drain method of claim 10 wherein the step of forming a hardmask layer comprises depositing a polysilicon layer.

12. The quasi-damascene gate, self-aligned source/drain method of claim 10 wherein the step of forming a hardmask layer comprises depositing a carbon antireflective coating layer.

13. The quasi-damascene gate, self-aligned source/drain method of claim 10 which further comprises steps of:

forming a mask layer over the hardmask layer.

14. The quasi-damascene gate, self-aligned source/drain method of claim 13 wherein the step of forming a mask layer over the hardmask layer comprises forming a photoresist mask layer.

15. The quasi-damascene gate, self-aligned source/drain method of claim 13 which further comprises steps of:

patterning the hardmask layer.

16. The quasi-damascene gate, self-aligned source/drain method of claim 15 wherein the step of patterning the hardmask layer comprises etching the hardmask layer and stripping the mask layer.

17. The quasi-damascene gate, self-aligned source/drain method of claim 15 which further comprises steps of:

forming hardmask spacers on the patterned hardmask layer.

18. The quasi-damascene gate, self-aligned source/drain method of claim 17 wherein the step of forming hardmask spacers on the patterned hardmask layer comprises depositing a polysilicon layer over the patterned hardmask layer.

19. The quasi-damascene gate, self-aligned source/drain method of claim 18 wherein the step of depositing a polysilicon layer comprises depositing the polysilicon layer by a low pressure chemical vapor deposition process.

20. The quasi-damascene gate, self-aligned source/drain method of claim 18 wherein the step of depositing a polysilicon layer comprises depositing about 100 Å of polysilicon.

21. The quasi-damascene gate, self-aligned source/drain method of claim 17 which further comprises steps of:

etching the self-aligning layer to expose the contact etch stop layer.

22. The quasi-damascene gate, self-aligned source/drain method of claim 21 wherein the step of etching the self-aligning layer to expose the contact etch stop layer comprises:

etching with a first selectivity and an interferometric endpoint method; and etching with a second selectivity.

23. The quasi-damascene gate, self-aligned source/drain method of claim 22 wherein: (a) the self-aligning layer is a nitride layer and the contact etch stop layer is an oxide layer; and (b) the step of etching with the first selectivity comprises performing a plasma dielectric recess etch with a nitride-to-oxide etch selectivity of greater than, or about equal, to 1.

24. The quasi-damascene gate, self-aligned source/drain method of claim 21 which further comprises steps of:

forming a protective layer on the self-aligning layer.

25. The quasi-damascene gate, self-aligned source/drain method of claim 24 wherein: (a) the self-aligning layer is a nitride layer; and (b) the step of forming a protective layer on the nitride layer comprises forming an oxide layer.

26. The quasi-damascene gate, self-aligned source/drain method of claim 24 which further comprises steps of:

removing a portion of the contact etch stop layer to expose a portion of the first gate electrode layer.

27. The quasi-damascene gate, self-aligned source/drain method of claim 26 wherein the step of removing the contact etch stop layer comprises etching with a process that stops on the first gate electrode layer.

28. The quasi-damascene gate, self-aligned source/drain method of claim 26 which further comprises steps of:

forming a second gate electrode layer over at least the exposed portion of the first gate electrode layer.

29. The quasi-damascene gate, self-aligned source/drain method of claim 28 wherein the step of forming a second gate electrode layer comprises forming a polysilicon layer.

30. The quasi-damascene gate, self-aligned source/drain method of claim 28 wherein the step of forming a second gate electrode layer comprises forming a tungsten layer.

31. The quasi-damascene gate, self-aligned source/drain method of claim 28 wherein the step of forming a second gate electrode layer comprises forming a silicon-germanium layer.

32. The quasi-damascene gate, self-aligned source/drain method of claim 28 wherein the step of forming a second gate electrode layer comprises forming a silicide layer.

33. The quasi-damascene gate, self-aligned source/drain method of claim 28 which further comprises steps of:

planarizing to a top of the self-aligning layer.

34. The quasi-damascene gate, self-aligned source/drain method of claim 33 which further comprises steps of:

implanting the second gate electrode layer.

35. The quasi-damascene gate, self-aligned source/drain method of claim 34 wherein the step of implanting comprises p doping first portions and n doping other portions.

36. The quasi-damascene gate, self-aligned source/drain method of claim 33 which further comprises steps of:

removing a portion of the second gate electrode layer.

37. The quasi-damascene gate, self-aligned source/drain method of claim 36 wherein the step of removing a portion of the second gate electrode layer comprises etching with an interferometric endpoint method.

38. The quasi-damascene gate, self-aligned source/drain method of claim 36 which further comprises steps of:

filling a recess over the second gate electrode layer.

39. The quasi-damascene gate, self-aligned source/drain method of claim 38 wherein the step of filling a recess over the second gate electrode layer comprises forming an oxide layer and planarizing to a top of the self-aligning layer.

40. The quasi-damascene gate, self-aligned source/drain method of claim 38 which further comprises steps of:

opening a contact hole to the second gate electrode layer; and filling the contact hole with a conductor.

41. The quasi-damascene gate, self-aligned source/drain method of claim 40 which further comprises steps of:

removing the self-aligning layer to form source and drain contact apertures.

42. The quasi-damascene gate, self-aligned source/drain method of claim 41 wherein: (a) the self-aligning layer is a nitride layer; and (b) the step of removing the self-aligning layer comprises wet etching.

43. The quasi-damascene gate, self-aligned source/drain method of claim 42 wherein the step of wet etching comprises wet etching with $H_3PO_4$ which stops on the contact etch stop layer.

44. The quasi-damascene gate, self-aligned source/drain method of claim 41 which further comprises steps of:
removing a portion of the protection layer and a portion of the first gate electrode layer.

45. The quasi-damascene gate, self-aligned source/drain method of claim 44 which further comprises steps of:
implanting to form source and drain areas.

46. The quasi-damascene gate, self-aligned source/drain method of claim 45 which further comprises steps of:
forming spacers and lightly doped drain areas.

47. The quasi-damascene gate, self-aligned source/drain method of claim 46 which further comprises steps of:
removing the gate dielectric layer over the source and drain areas.

48. The quasi-damascene gate, self-aligned source/drain method of claim 47 wherein the step of removing the gate dielectric layer over the source and drain areas comprises wet etching.

49. The quasi-damascene gate; self-aligned source/drain method of claim 47 which further comprises steps of:
forming silicide layers over the source and drain areas.

50. The quasi-damascene gate, self-aligned source/drain method of claim 49 which further comprises steps of:
filling the source and drain contact apertures with a conductor.

51. A quasi-damascene gate, self-aligned source/drain method for forming a device on a substrate that comprises steps of:
etching a self-aligning layer of a structure to define a gate electrode dimension, which structure comprises a substrate, a gate dielectric layer, a first gate electrode layer, an oxide contact etch stop layer and a self-aligning layer.

52. The quasi-damascene gate, self-aligned source/drain method of claim 51 which further comprises steps of:
forming a second gate electrode layer over the first gate electrode layer.

53. The quasi-damascene gate, self-aligned source/drain method of claim 52 which further comprises steps of:
removing the self-aligning layer to form source and drain contact apertures.

54. The quasi-damascene gate, self-aligned source/drain method of claim 53 wherein the step of removing the self-aligning layer comprises wet etching which stops on the contact etch stop layer.

* * * * *